United States Patent
Tsukidate (10) Patent No.: US 10,566,948 B2
(45) Date of Patent: Feb. 18, 2020

(54) ACOUSTIC WAVE DEVICE

(71) Applicant: TAIYO YUDEN CO., LTD., Tokyo (JP)

(72) Inventor: Hitoshi Tsukidate, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 79 days.

(21) Appl. No.: 15/818,522

(22) Filed: Nov. 20, 2017

(65) Prior Publication Data

US 2018/0175823 A1 Jun. 21, 2018

(30) Foreign Application Priority Data

Dec. 21, 2016 (JP) .................................. 2016-248371

(51) Int. Cl.
*H03H 9/05* (2006.01)
*H03H 9/64* (2006.01)
(Continued)

(52) U.S. Cl.
CPC ........ *H03H 9/059* (2013.01); *H03H 9/02543* (2013.01); *H03H 9/0576* (2013.01);
(Continued)

(58) Field of Classification Search
CPC .. H03H 9/059; H03H 9/02543; H03H 9/0576; H03H 9/64; H03H 9/72; H03H 9/725; H01L 2224/73204
(Continued)

(56) References Cited

U.S. PATENT DOCUMENTS 6,754,471 B1 * 6/2004 Vakilian ............... H03H 9/0542
438/108
2004/0113215 A1 * 6/2004 Shimada .................. G01H 3/12
257/414
(Continued)

FOREIGN PATENT DOCUMENTS

JP H08-330880 A 12/1996
JP 2000-91880 A 3/2000
(Continued)

OTHER PUBLICATIONS

Japanese Office Action dated Feb. 5, 2019, in a counterpart Japanese patent application No. 2016-248371. A machine translation (not reviewed for accuracy) attached.).
(Continued)

*Primary Examiner* — Benny T Lee
*Assistant Examiner* — Hafizur Rahman
(74) *Attorney, Agent, or Firm* — Chen Yoshimura LLP (57) ABSTRACT

An acoustic wave device includes: a first substrate including a terminal located on a lower surface thereof; a second substrate including an acoustic wave element located on a lower surface thereof and mounted on the first substrate so that the element faces the first substrate; first bumps located between the first and second substrates, located between a first side of the first substrate and the element, and not connected to the element and the terminal; second bumps located between the first and second substrates, located between a second side facing the first side and the element, and not connected to the element and/or the terminal; and third bumps located between the first and second substrates, located only in a region located closer to the second side than the first bumps are and closer to the first side than the second bumps are, and connecting the element and the terminal.

10 Claims, 11 Drawing Sheets

(51) Int. Cl.
　　　*H03H 9/02*　　　(2006.01)
　　　*H03H 9/72*　　　(2006.01)

(52) U.S. Cl.
　　　CPC .............. *H03H 9/64* (2013.01); *H03H 9/72* (2013.01); *H03H 9/725* (2013.01)

(58) Field of Classification Search
　　　USPC ........................................................... 333/4
　　　See application file for complete search history.

(56) References Cited

U.S. PATENT DOCUMENTS

| | | | | |
|---|---|---|---|---|
| 2009/0243430 | A1* | 10/2009 | Yokota | H03H 9/14541 |
| | | | | 310/313 B |
| 2014/0184019 | A1* | 7/2014 | Yamato | H03H 9/0576 |
| | | | | 310/313 R |
| 2015/0372659 | A1* | 12/2015 | Shin | H01L 41/053 |
| | | | | 310/313 A |

FOREIGN PATENT DOCUMENTS

| | | |
|---|---|---|
| JP | 2003-263117 A | 9/2003 |
| JP | 2006-19370 A | 1/2006 |

OTHER PUBLICATIONS

Japanese Office Action dated Aug. 13, 2019, in a counterpart Japanese patent application No. 2016-248371. A machine translation (not reviewed for accuracy) attached.).

* cited by examiner

| BUMP | MAXIMUM STRESS [×10⁹ Pa] | | |
|---|---|---|---|
| | +25°C | -40°C | +125°C |
| 36a | 2.22 | 1.29 | 3.57 |
| 36b | 2.01 | 1.14 | 3.23 |
| 36c | 1.64 | 1.08 | 2.81 |
| 36d | 1.56 | 1.02 | 2.71 |

ACOUSTIC WAVE DEVICE

CROSS-REFERENCE TO RELATED APPLICATION

This application is based upon and claims the benefit of priority of the prior Japanese Patent Application No. 2016-248371, filed on Dec. 21, 2016, the entire contents of which are incorporated herein by reference.

FIELD

A certain aspect of the present invention relates to an acoustic wave device.

BACKGROUND

A method that bonds substrates together so that the substrates face each other across an air gap has been used as a method for packaging an acoustic wave device. It has been known to provide a part of a bump on a dummy pad as disclosed in, for example, Japanese Patent Application Publication No. 2000-91880 (Patent Document 1).

The provision of the bump on the dummy pad inhibits the stress rupture of the bump due to the difference in linear thermal expansion coefficient. However, when the substrates are bonded together across an air gap, the peeling or rupture of the bump causes the bump to be electrically opened. The reduction of such a malfunction of the bump is insufficient in Patent Document 1.

SUMMARY OF THE INVENTION

According to an aspect of the present invention, there is provided an acoustic wave device including: a first substrate including a terminal located on a lower surface thereof and having a substantially rectangular planar shape; at least one second substrate including an acoustic wave element located on a lower surface thereof and mounted on the first substrate so that the acoustic wave element faces an upper surface of the first substrate across an air gap; a plurality of first bumps located between the upper surface of the first substrate and the lower surface of the at least one second substrate, located between a first side of the first substrate and the acoustic wave element in a direction perpendicular to the first side in plan view, and not electrically connected to at least one of the acoustic wave element and the terminal; a plurality of second bumps located between the upper surface of the first substrate and the lower surface of the at least one second substrate, located between a second side, which faces the first side, and the acoustic wave element in the direction perpendicular to the first side in plan view, and not electrically connected to at least one of the acoustic wave element and the terminal; and a plurality of third bumps located between the upper surface of the first substrate and the lower surface of the at least one second substrate, located only in a region that is located closer to the second side than the plurality of first bumps are and closer to the first side than the plurality of second bumps are, and electrically connecting the acoustic wave element and the terminal.

DETAILED DESCRIPTION

First Comparative Example

Figure 1:
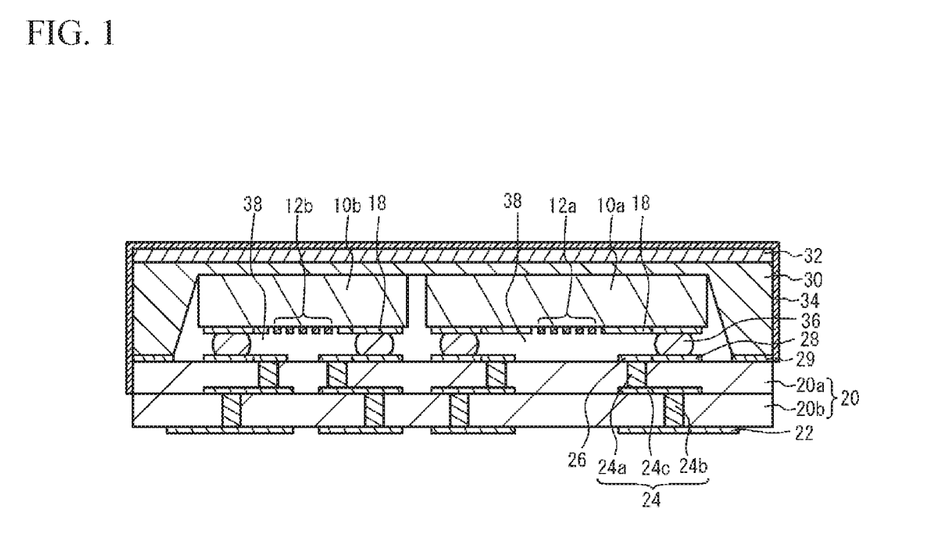
FIG. 1 is a cross-sectional view of an acoustic wave device in accordance with a first comparative example.

FIG. 1 is a cross-sectional view of an acoustic wave device in accordance with a first comparative example. As illustrated in FIG. 1, substrates 10a and 10b are mounted on the upper surface of a substrate 20. The substrate 20 is an insulating substrate, and is, for example, a ceramic substrate made of high temperature co-fired ceramic (HTCC) or low temperature co-fired ceramic (LTCC) or a resin substrate. The substrate 20 includes insulating layers 20a and 20b that are stacked. Wiring lines 26 and pads 28 are located on the upper surface of the insulating layer 20a. Wiring lines 24c are located on the upper surface of the insulating layer 20b. Terminals 22 are formed on the lower surface of the insulating layer 20b. Via wirings 24a and 24b respectively penetrating through the insulating layers 20a and 20b are formed. The via wiring 24a electrically connects the pad 28 to the wiring line 24c, while the via wiring 24b electrically connects the wiring line 24c to the terminal 22. An internal wiring line 24 includes the via wirings 24a and 24b and the wiring line 24c, and electrically connects the pad 28 and the terminal 22.

The upper surface of the substrate 20 is, for example, flat, and a ring-shaped electrode 29 is located in the outer periphery of the upper surface so as to surround the wiring lines 26 and the pads 28. The pad 28 is a pad to which a bump 36 is bonded. The terminals 22, the wiring lines 24c and 26, the pads 28, the via wirings 24a and 24b are formed of metal layers such as tungsten layers, copper layers, gold layers, or aluminum layers. The ring-shaped electrode 29 is formed of a metal layer such as a tungsten layer, a nickel layer, or a copper layer.

An acoustic wave element 12a and pads 18 are located on the lower surface of the substrate 10a. An acoustic wave element 12b and the pads 18 are located on the lower surface of the substrate 10b. The bump 36 is bonded to the pad 18. The substrates 10a and 10b are mounted on the substrate 20 through the bumps 36. The acoustic wave elements 12a and 12b face the substrate 20 across air gaps 38. Since the acoustic wave elements 12a and 12b are exposed to the air gaps 38, the vibration of the acoustic wave elements 12a and 12b is not restrained. The bump 36 is a metal bump such as a gold bump, a copper bump, or a solder bump. The substrates 10a and 10b are piezoelectric substrates or insulating substrates.

A sealing portion 30 is located on the upper surface of the substrate 20 so as to surround the substrates 10a and 10b. The sealing portion 30 is bonded with the ring-shaped electrode 29. The sealing portion 30 is made of, for example, metal such as SnAg solder or AuSn solder, or resin. The sealing portion 30 hermetically seals the acoustic wave elements 12a and 12b in the air gaps 38. A lid 32 is located on the sealing portion 30. The lid 32 is a metal plate such as a kovar plate or an insulating plate. The protective film 34 is located so as to surround the sealing portion 30 and the lid 32. The protective film 34 is a metal film such as a nickel film or an insulating film.

Figure 2:
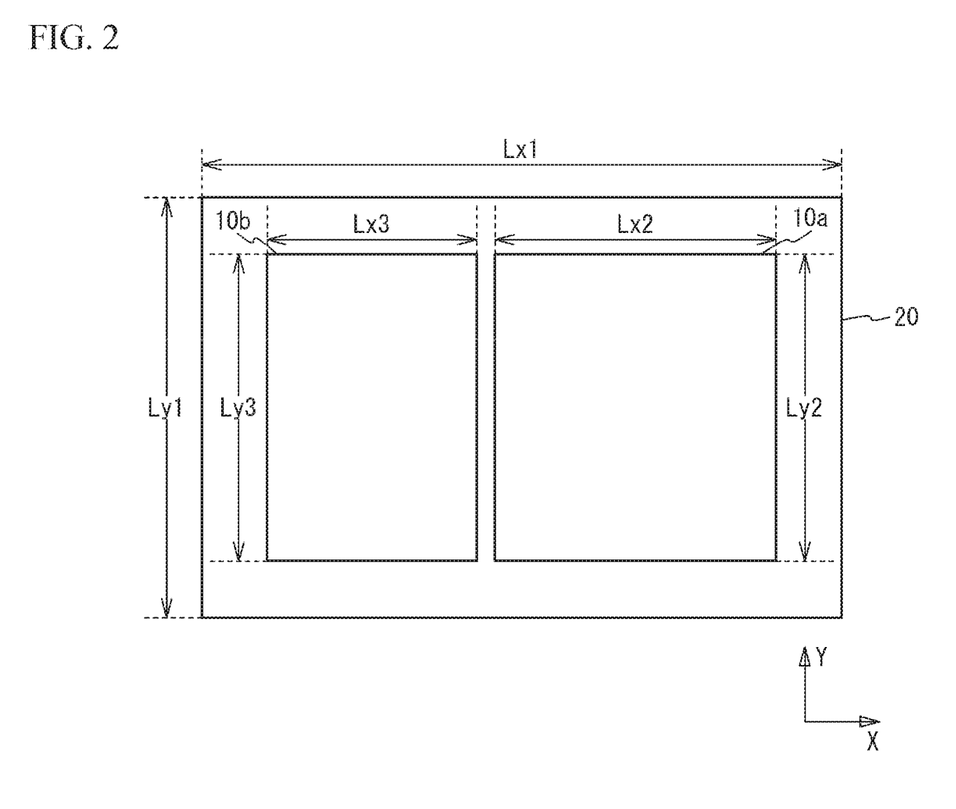
FIG. 2 is a plan view of the acoustic wave device in accordance with the first comparative example.

FIG. 2 is a plan view of the acoustic wave device in accordance with the first comparative example. As illustrated in FIG. 2, the substrate 20 has a rectangular planar shape. The dimensions in the X direction and the Y direction of the substrate 20 are respectively represented by Lx1 and Ly1. The dimensions in the X direction and the Y direction of the substrate 10a are respectively represented by Lx2 and Ly2. The dimensions in the X direction and the Y direction of the substrate 10b are respectively represented by Lx3 and Ly3.

In the first comparative example, the stress applied to the bump 36 was simulated. Simulation conditions are as follows.

Substrate 20:
  Material: HTCC;
  Thickness: 125 μm;
  Linear thermal expansion coefficient: 7.1 $\mu K^{-1}$;
  Lx1: 1.5 mm; and
  Ly1: 1.1 mm
Bump 36:
  Material: gold;
  Thickness: 25 μm;
  Diameter: 60 μm;
  Linear thermal expansion coefficient: 14.4 $\mu K^{-1}$
Substrates 10a and 10b:
  Material: 42° Y-cut X-propagation lithium tantalate;
  Thickness: 150 μm;
  Linear thermal expansion coefficient (X direction/Y direction): 16.1 $\mu K^{-1}$/9.5 $\mu K^{-1}$;
  Lx2: 0.71 mm;
  Ly2: 0.82 mm;
  Lx3: 0.46 mm; and
  Ly3: 0.82 mm
The X direction was assumed to be in the direction of the X-axis orientation.
Sealing portion 30:
  Material: AgSn solder;
  Thickness on the substrates 10a and 10b: 35 μm;
  Linear thermal expansion coefficient: 30 $\mu K^{-1}$
Lid 32:
  Material: kovar;
  Thickness: 25 μm; and
  Linear thermal expansion coefficient: 5.13 $K^{-1}$
Protective film 34:
  Material: nickel;
  Thickness: 10 μm; and
  Linear thermal expansion coefficient: 14 $\mu K^{-1}$
The terminals 22, the internal wiring lines 24, the wiring lines 26, the pads 28, the ring-shaped electrode 29, the acoustic wave elements 12a and 12b, wiring lines 16, and the pads 18 are not taken into consideration in the simulation.

Figure 3A:
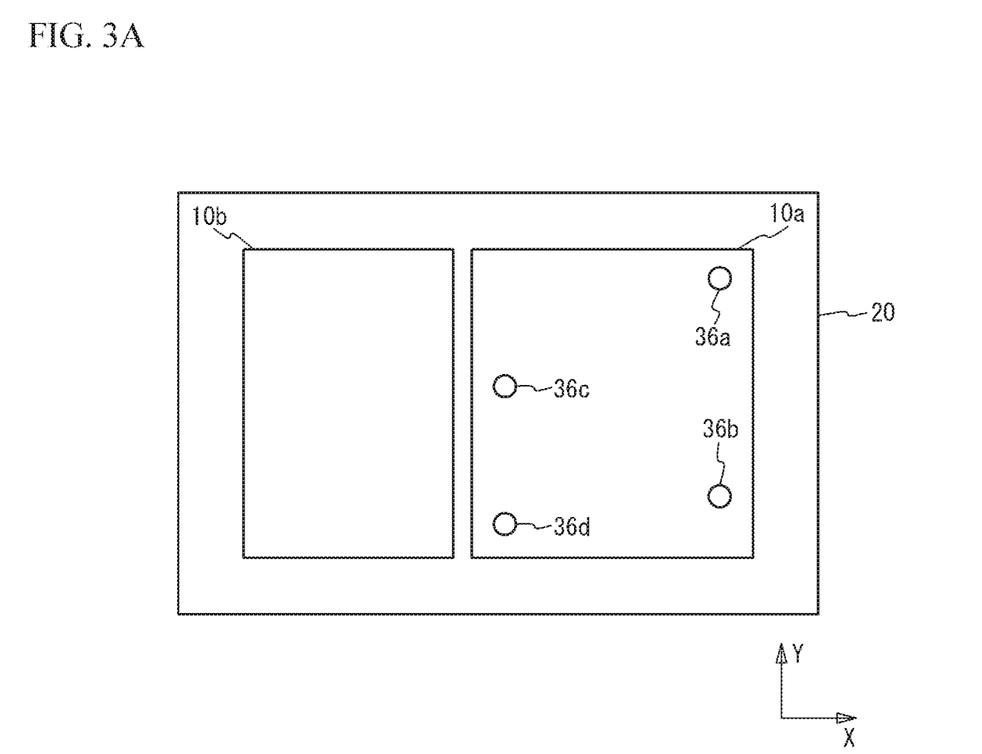
FIG. 3A illustrates locations of bumps in the first comparative example.
Figure 3B:
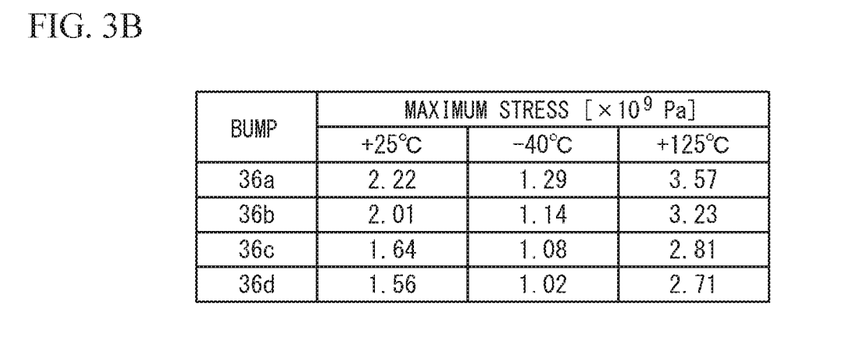
FIG. 3B illustrates maximum stress applied to each bump.

FIG. 3A illustrates the locations of the bumps in the first comparative example, and FIG. 3B illustrates maximum stress applied to each bump. As illustrated in FIG. 3A and FIG. 3B, the stress applied to the bump was calculated under the assumption that bumps 36a through 36d are arranged on the substrate 10a. The temperature was assumed to be 25° C., −40° C., and 125° C.

As illustrated in FIG. 3B, at any temperature, the bump applied with the largest stress is the bump 36a, and the bump applied with the second largest stress is the bump 36b. The stresses applied to the bumps 36c and 36d are very small compared to those applied to the bumps 36a and 36b. When the stress applied to the bump 36 is large, the bond between the bump 36 and the pad 28 or 18 may be peeled or the bump 36 may be ruptured. The peeling or rupture electrically opens between the pads 28 and 18.

First Embodiment

Figure 4:
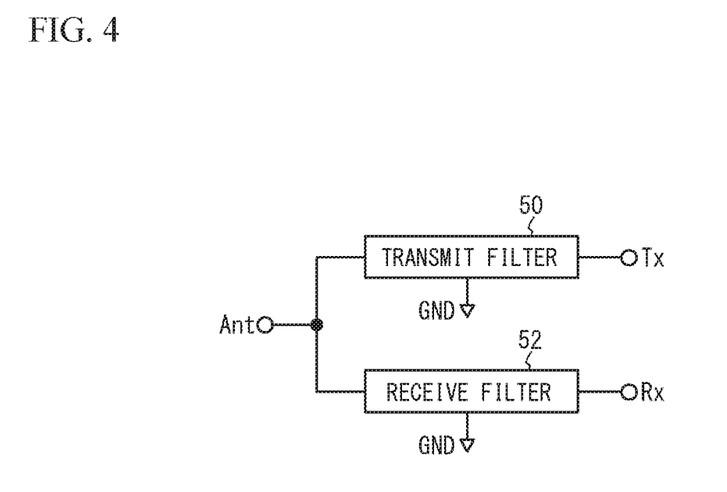
FIG. 4 is a circuit diagram of a duplexer included in an acoustic wave device in accordance with a first embodiment.

FIG. 4 is a circuit diagram of a duplexer included in an acoustic wave device in accordance with a first embodiment. As illustrated in FIG. 4, a transmit filter 50 is connected between a common terminal Ant and a transmit terminal Tx. A receive filter 52 is connected between the common terminal Ant and a receive terminal Rx. The transmit filter 50 and the receive filter 52 are coupled to ground terminals GND. The transmit filter 50 transmits signals in the transmit band to the common terminal Ant among high-frequency signals input to the transmit terminal Tx, and suppresses signals with other frequencies. The receive filter 52 transmits signals in the receive band to the receive terminal Rx among high-frequency signals input to the common terminal Ant, and suppresses signals with other frequencies.

Figure 5A:
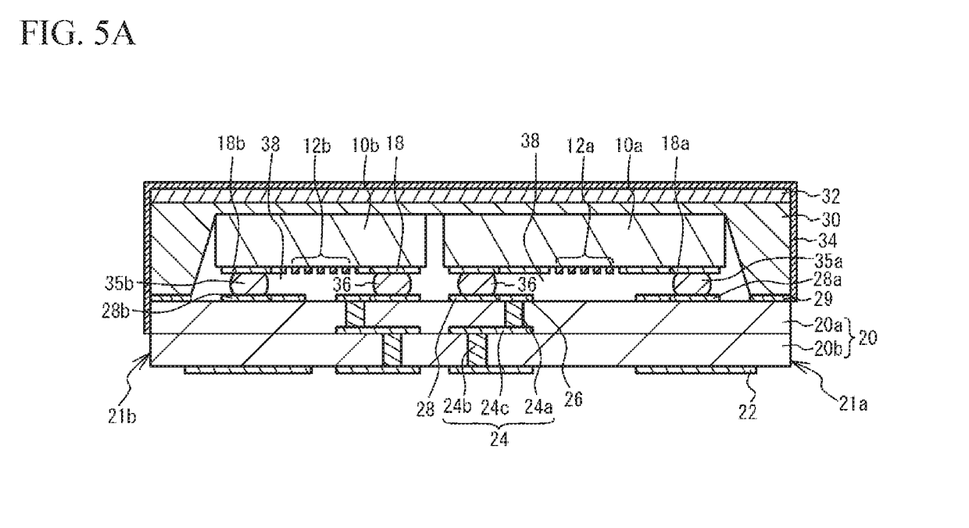
FIG. 5A and FIG. 5B are cross-sectional views of the acoustic wave device in accordance with the first embodiment.
Figure 5B:
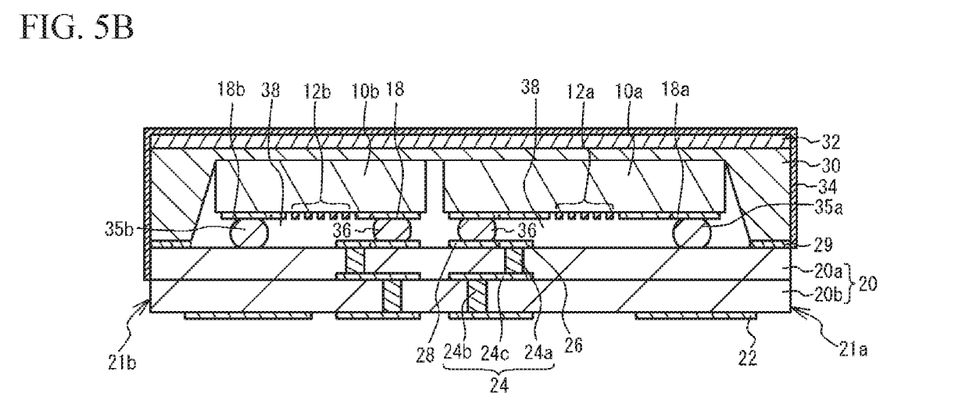
Figure 6:
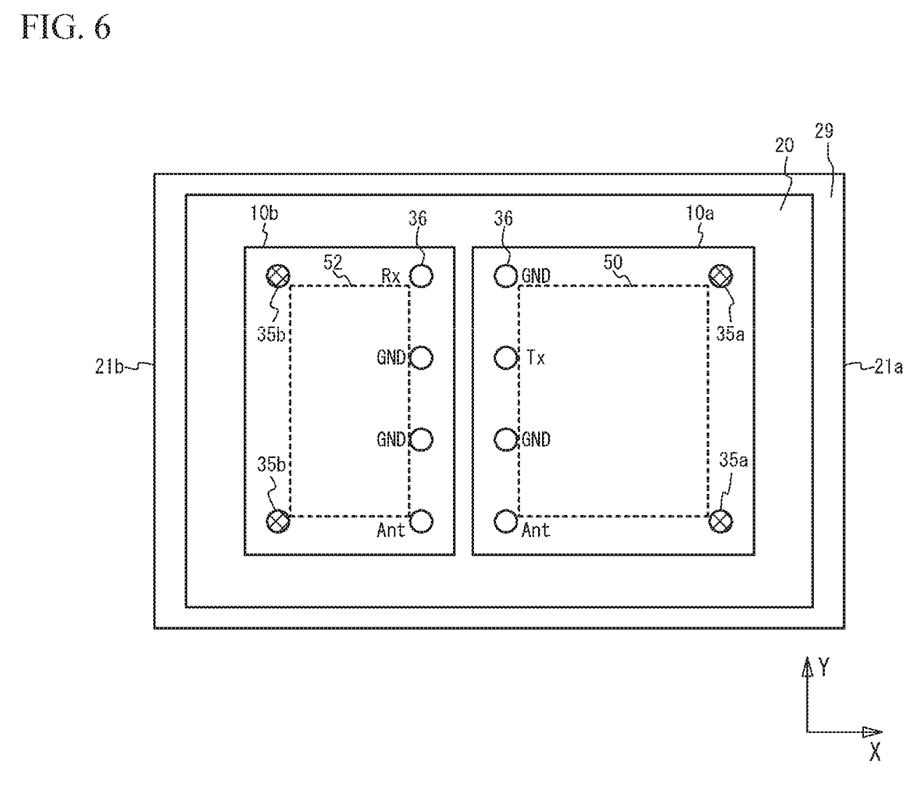
FIG. 6 is a plan view of the acoustic wave device in accordance with the first embodiment.

FIG. 5A and FIG. 5B are cross-sectional views of an acoustic wave device in accordance with the first embodiment. FIG. 6 is a plan view of the acoustic wave device in accordance with the first embodiment. As illustrated in FIG. 5A and FIG. 6, the planar shape of the substrate 20 is a rectangular shape, and shorter sides facing each other are referred to as sides 21a and 21b. Pads 28a and 28b are respectively located adjacent to the sides 21a and 21b of the upper surface of the substrate 20. Pads 18a and 18b are respectively located adjacent to the sides 21a and 21b of the lower surfaces of the substrates 10a and 10b. The pads 18a and 18b are electrically connected to neither the acoustic wave element 12a nor 12b. The pads 28a and 28b are electrically connected to none of the terminals 22.

Dummy bumps 35a are bonded to the pads 18a and 28a, and dummy bumps 35b are bonded to the pads 18b and 28b. The dummy bumps 35a and 35b electrically connect to none of the acoustic wave elements 12a and 12b and the terminals 22. The dummy bumps 35a and 35b electrically connect to none of the acoustic wave elements 12a and 12b and/or electrically connect to none of the terminals 22. The dummy bumps 35a and 35b are bumps mechanically supporting the substrates 10a and 10b. Connection bumps 36 are located between the dummy bumps 35a and 35b. The connection bump 36 electrically connects at least one of the acoustic wave elements 12a and 12b and at least one of the terminals 22.

As illustrated in FIG. 5B, the pads 28a and 28b may not be necessarily provided. In this structure, the dummy bumps 35a and 35b are in contact with the upper surface of the substrate 20, but are not bonded with the substrate 20.

As illustrated in FIG. 6, the transmit filter 50 and the receive filter 52 are respectively located on the substrates 10a and 10b. The common terminal Ant, the transmit terminal Tx, the receive terminal Rx, and the ground terminals GND correspond to the terminals 22 in FIG. 5A and FIG. 5B. The connection bumps 36 located under the substrate 10a are electrically connected to the common terminal Ant, the transmit terminal Tx, and the ground terminals GND. The connection bumps 36 located under the substrate 10b are electrically connected to the common terminal Ant, the receive terminal Rx, and the ground terminals GND. Other structures are the same as those of the first comparative example, and the description thereof is thus omitted.

Figure 7A:
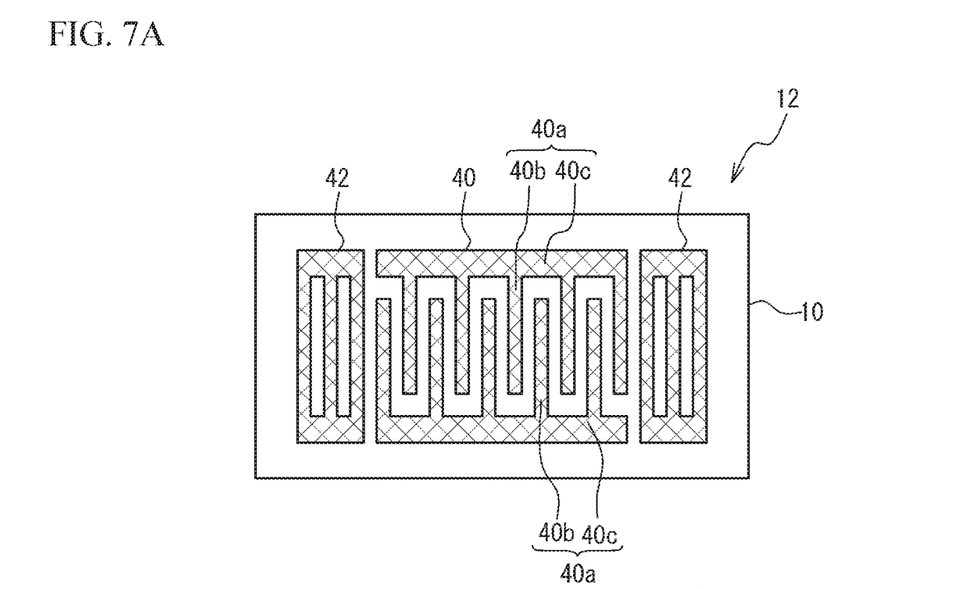
FIG. 7A is a plan view illustrating an example in which the acoustic wave element is a surface acoustic wave resonator in the first embodiment.
Figure 7B:
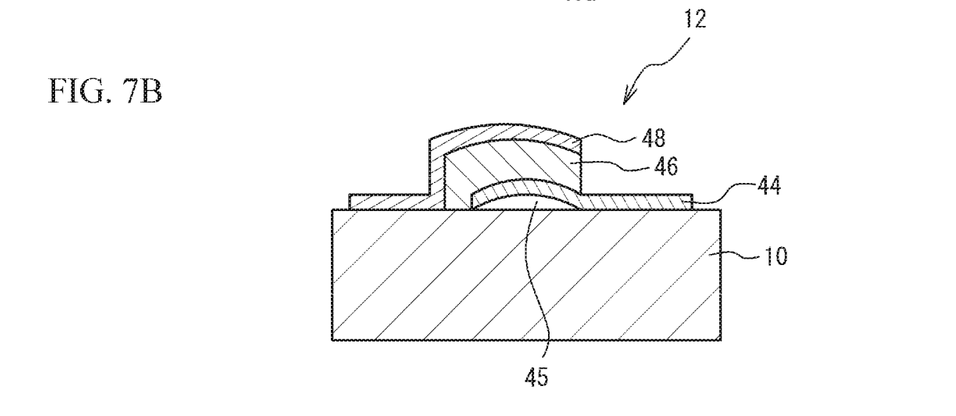
FIG. 7B is a cross-sectional view illustrating an example in which the acoustic wave element is a piezoelectric thin film resonator.

FIG. 7A is a plan view illustrating an example in which the acoustic wave element is a surface acoustic wave resonator in the first embodiment, and FIG. 7B is a cross-sectional view illustrating an example in which the acoustic wave element is a piezoelectric thin film resonator. As illustrated in FIG. 7A, an interdigital transducer (IDT) 40 and reflectors 42 are located on the piezoelectric substrate 10. The IDT 40 includes a pair of comb-shaped electrodes 40a facing each other. The comb-shaped electrode 40a includes a plurality of electrode fingers 40b and a bus bar 40c to which the electrode fingers 40b are coupled. The reflectors 42 are located at both sides of the IDT 40. The IDT 40 excites a surface acoustic wave on the piezoelectric substrate 10. The piezoelectric substrate 10 is, for example, a lithium tantalate substrate or a lithium niobate substrate. The IDT 40 and the reflectors 42 are formed of, for example, an aluminum film or a copper film. The piezoelectric substrate 10 may be bonded on the lower surface of a support substrate such as a sapphire substrate, an alumina substrate, a spinel substrate, or a silicon substrate. A protective film or a temperature compensation film covering the IDT 40 and the reflectors 42 may be provided. In this structure, the surface acoustic wave and the protective film or the temperature compensation film function as the acoustic wave element 12a as a whole.

As illustrated in FIG. 7B, a piezoelectric film 46 is located on the substrate 10. A lower electrode 44 and an upper electrode 48 are located so as to sandwich the piezoelectric film 46. An air gap 45 is formed between the lower electrode 44 and the substrate 10. The lower electrode 44 and the upper electrode 48 excite an acoustic wave in the thickness extension mode inside the piezoelectric film 46. As described above, the lower electrode 44 and the upper electrode 48 are formed of a metal film such as, for example, a ruthenium film. The piezoelectric film 46 is, for example, an aluminum nitride film. The substrate 10 is, for example, a semiconductor substrate such as a silicon substrate or a gallium arsenide substrate, or an insulating substrate such as a sapphire substrate, an alumina substrate, a spinel substrate, or a glass substrate. As illustrated in FIG. 7A and FIG. 7B, an acoustic wave element 12 includes an electrode that excites the acoustic wave. Thus, the acoustic wave element 12 is covered with the air gap 38 so as not to restrain the acoustic wave.

Figure 8:
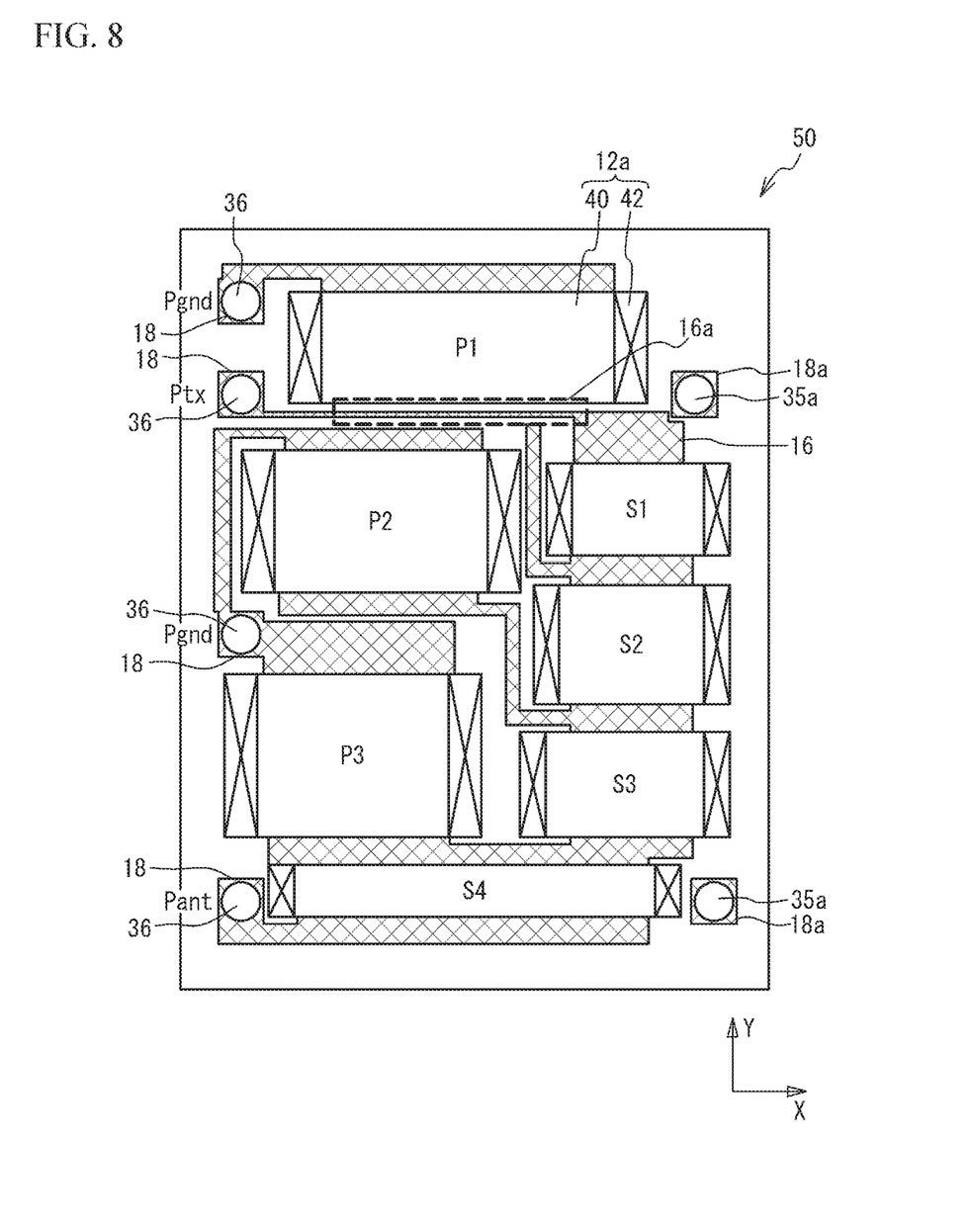
FIG. 8 is a plan view of an example of the substrate of a transmit filter in the first embodiment.

FIG. 8 is a plan view of an example of the substrate of the transmit filter in the first embodiment. FIG. 8 illustrates the lower surface of the substrate 10a as viewed transparently from above. As illustrated in FIG. 8, located on the lower surface of the substrate 10a are the acoustic wave elements 12a, wiring lines 16 and 16a, and the pads 18 and 18a. Each of the acoustic wave elements 12a is the surface acoustic wave resonator illustrated in FIG. 7A, and includes the IDT 40 and the reflectors 42. The X direction is in the direction of the X-axis orientation of the substrate 10a. Each of the wiring lines 16 and 16a electrically connects between the acoustic wave elements 12a and/or electrically connects the acoustic wave element 12a to the pad 18. The wiring lines 16 and 16a intersect with each other in the vertical direction across an air gap or an insulating material. The pad 18a is not electrically connected to the acoustic wave element 12a. The connection bump 36 is bonded with the pad 18, and the dummy bump 35a is bonded with the pad 18a.

The acoustic wave elements 12a include series resonators S1 through S4 and parallel resonators P1 through P3. The pads 18 include a common pad Pant, a transmit pad Ptx, and ground pads Pgnd. The common pad Pant, the transmit pad Ptx, and the ground pads Pgnd are respectively electrically connected to the common terminal Ant, the transmit terminal Tx, and the ground terminals GND through the connection bumps 36. The series resonators S1 through S4 are connected in series between the transmit pad Ptx and the common pad Pant. The parallel resonators P1 through P3 are connected in parallel between the transmit pad Ptx and the common pad Pant. The first ends of the parallel resonators P1 through P3 are electrically connected to the ground pads Pgnd. The series resonators S1 through S4 and the parallel resonators P1 through P3 form the transmit filter 50.

Figure 9:
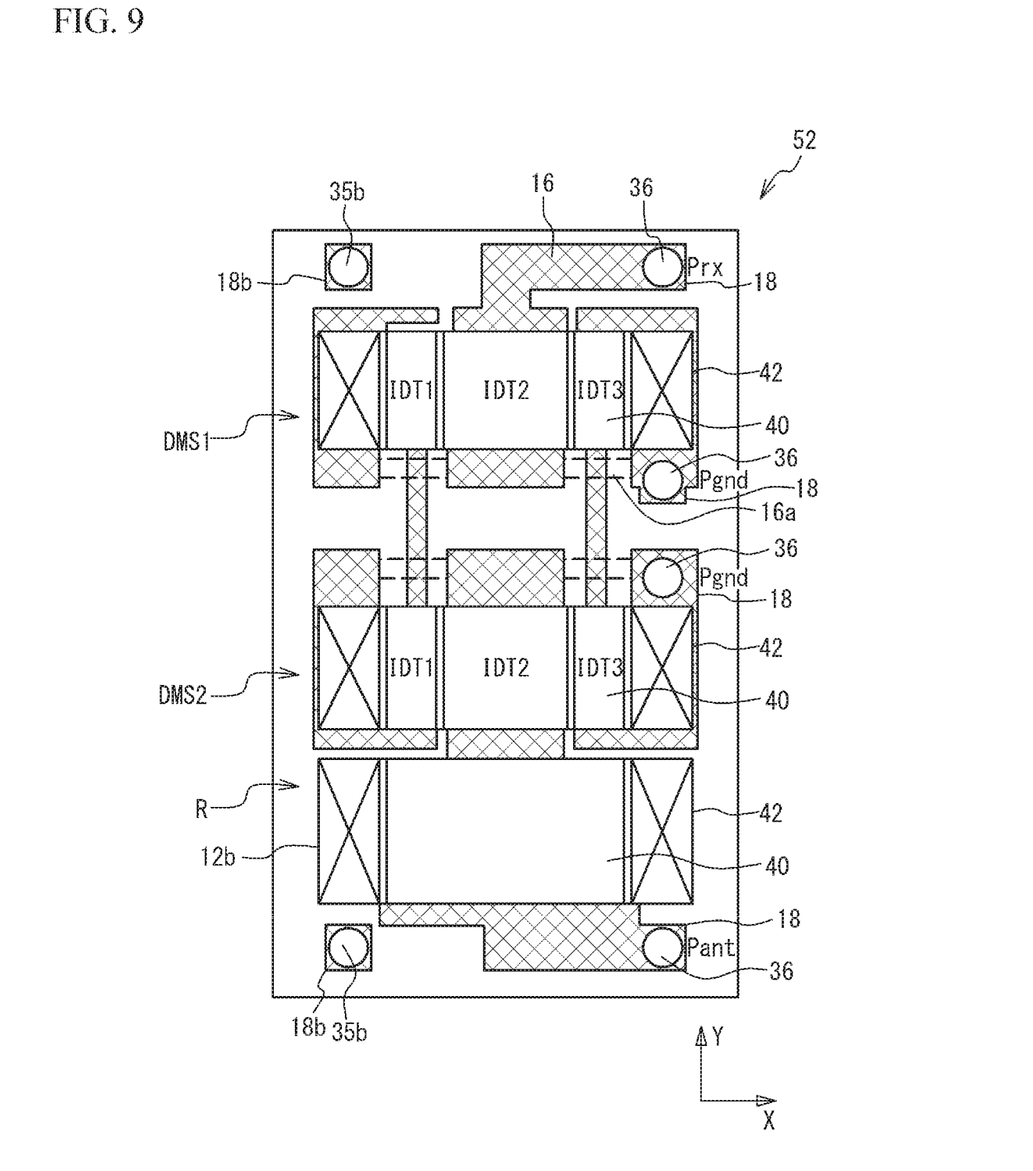
FIG. 9 is a plan view of an example of the substrate of a receive filter in the first embodiment.

FIG. 9 is a plan view illustrating an example of the substrate of the receive filter of the first embodiment. FIG. 9 illustrates the lower surface of the substrate 10b as transparently viewed from above. As illustrated in FIG. 9, the acoustic wave elements 12b, the wiring lines 16 and 16a, and the pads 18 and 18b are located on the lower surface of the substrate 10b. Each of the acoustic wave elements 12b is the surface acoustic wave resonator illustrated in FIG. 7A, and includes the IDT 40 and the reflectors 42. Each of the wiring lines 16 and 16a electrically connects between the acoustic wave elements 12b and/or electrically connects the acoustic wave element 12b to the pad 18. The wiring lines 16 and 16a intersect with each other in the vertical direction across an air gap or an insulating material. The pads 18b are not electrically connected to the acoustic wave element 12b. The connection bump 36 is bonded with the pad 18, and the dummy bump 35b is bonded with the pad 18b.

The acoustic wave elements 12b include a one-port acoustic wave resonator R and multimode filters DMS1 and DMS2. In each of DMS1 and DMS2, IDT1 through IDT3 as the IDT 40 are arranged between the reflectors 42. The pads 18 include the common pad Pant, the receive pad Prx, and the ground pads Pgnd. The common pad Pant, the receive pad Prx, and the ground pads Pgnd are respectively electrically connected to the common terminal Ant, the receive terminal Rx, and the ground terminals GND through the connection bumps 36. The multimode filters DMS1 and DMS2 and the one-port acoustic wave resonator R are connected between the receive pad Prx and the common pad Pant. DMS1 and DMS2 are electrically connected to the ground pads Pgnd. The one-port acoustic wave resonator R and the multimode filters DMS1 and DMS2 form the receive filter 52.

Second Embodiment

Figure 10:
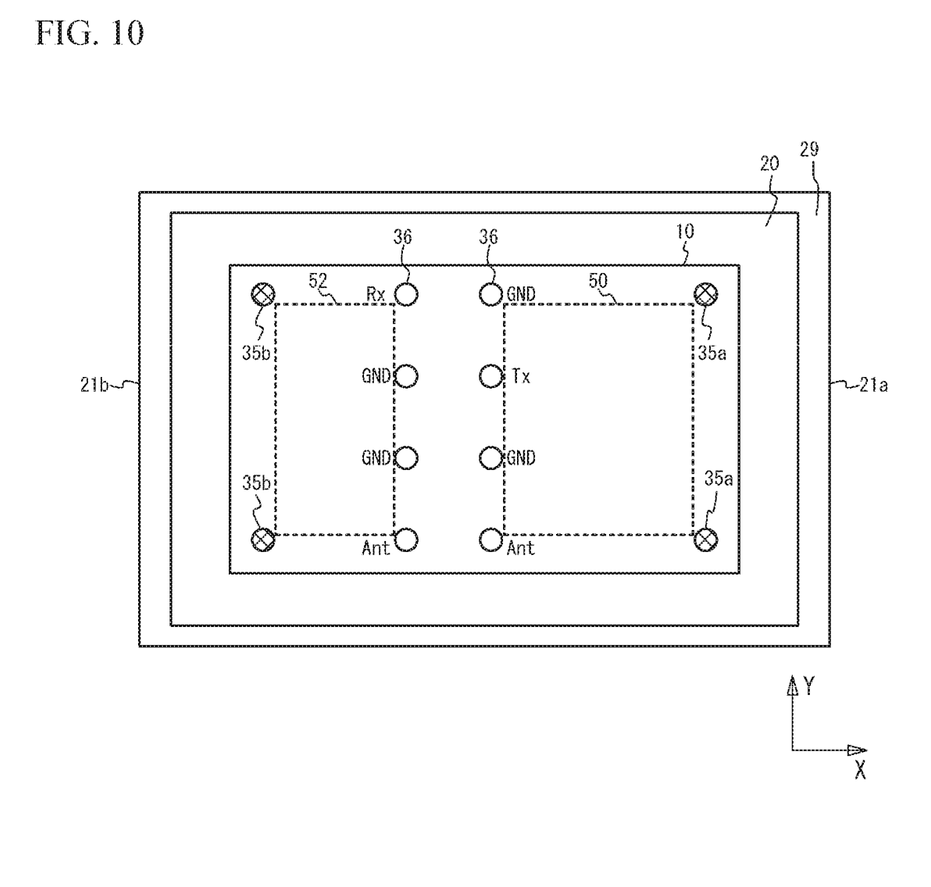
FIG. 10 is a plan view of an acoustic wave device in accordance with a second embodiment.

FIG. 10 is a plan view of an acoustic wave device in accordance with a second embodiment. As illustrated in FIG. 10, a single substrate 10 is located on the substrate 20. The transmit filter 50 and the receive filter 52 are located on the substrate 10. Other structures are the same as those of the first embodiment, and the description thereof is thus omitted.

Third Embodiment

Figure 11:
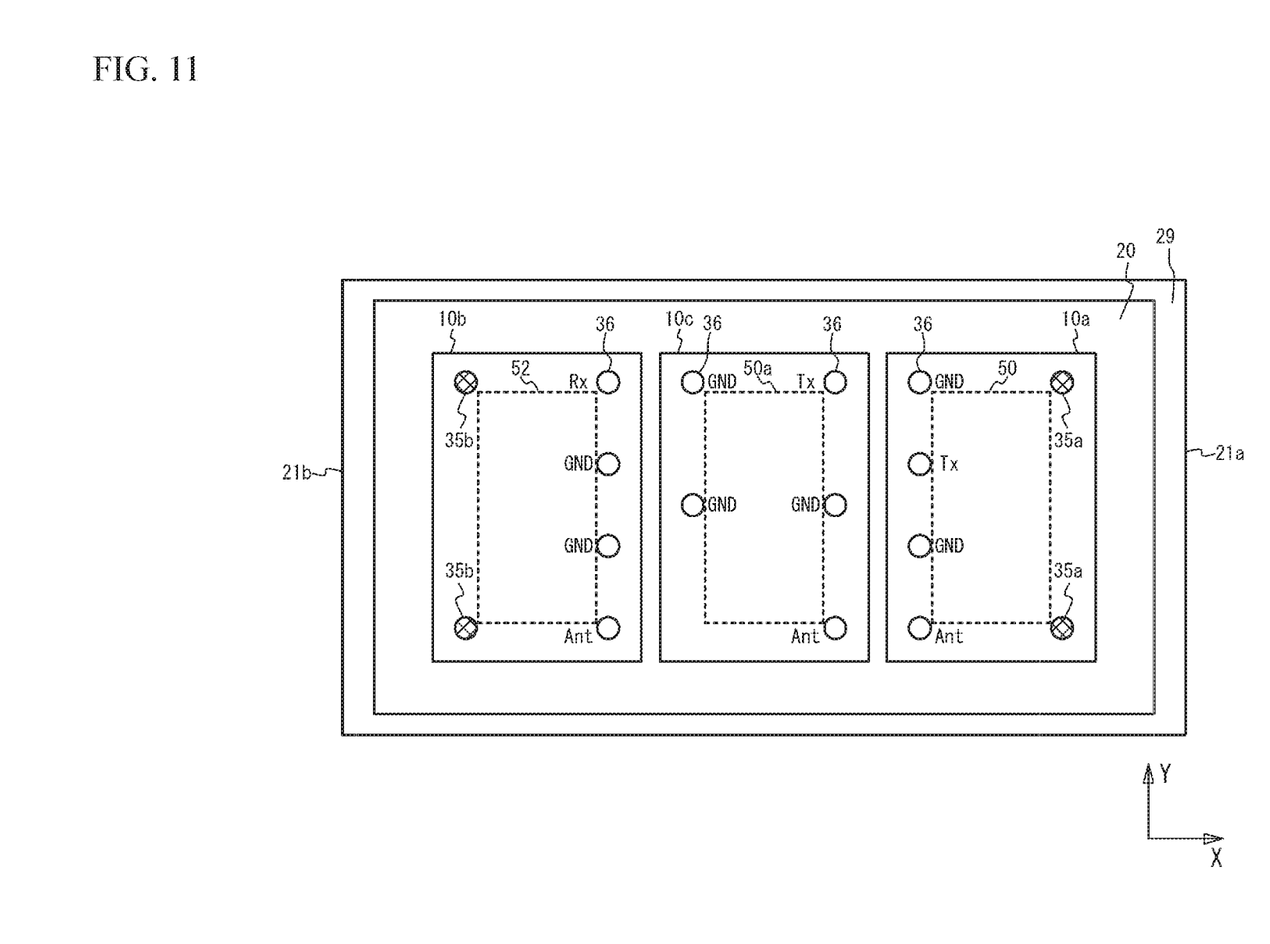
FIG. 11 is a plan view of an acoustic wave device in accordance with a third embodiment.

FIG. 11 is a plan view of an acoustic wave device in accordance with a third embodiment. As illustrated in FIG. 11, a plurality of substrates 10a through 10c are located on the substrate 20. The substrate 10c is located between the substrate 10a and the substrate 10b. A transmit filter 50a is located on the substrate 10c. All the bumps bonded with the substrate 10c are the connection bumps 36. Other structures are the same as those of the first embodiment, and the description thereof is thus omitted.

In the first through third embodiments, the dummy bumps 35a and 35b and the connection bumps 36 are located between the upper surface of the substrate 10 (a first substrate) and the lower surface of at least one substrate 10 or 10a, 10b, and/or 10c (a second substrate). A plurality of dummy bumps 35a (first dummy bumps) are located between the side 21a (a first side) of the substrate 20 in the X direction (the direction perpendicular to the side 21a) and the acoustic wave elements 12a and 12b in plan view. For example, the dummy bumps 35a are located adjacent to and along the side 21a. A plurality of dummy bumps 35b (second dummy bumps) are located between the side 21b (a second side) in plan view in the X direction and the acoustic wave elements 12a and 12b. For example, the dummy bumps 35b are located adjacent to and along the side 21b. The bump located closest to the side 21b is the dummy bump 35b. A plurality of connection bumps 36 are located only in a region that is located closer to the side 21b than the dummy bumps 35a are and closer to the side 21a than the dummy bumps 35b are.

As described above, the bump located closest to the side 21a is the dummy bump 35a, and the bump located closest to the side 21b is the dummy bump 35b. All the connection bumps 36 are located between the dummy bumps 35a and 35b.

As described in the first comparative example, large stress is applied to the bump closest to the side 21a or 21b. Thus, the bumps closest to the side 21a or 21b is made to be the dummy bumps 35a and 35b. This structure inhibits the electrical opening between the acoustic wave elements 12a and 12b and the terminal 22 even when the bump is peeled or ruptured by stress. The connection bump 36 is located between the dummy bumps 35a and 35b. This structure reduces the stress applied to the connection bump 36, and thereby inhibits the peeling or rupture of the connection bump 36. The above structure further inhibits the malfunction of the bump. The provision of the dummy bumps 35a and 35b allows the substrates 10a and 10b to be mechanically supported.

As in the first and third embodiments, the substrates 10a through 10c are arranged in the direction from the side 21a to the side 21b (the X direction). The bump located closest to the side 21a among the bumps located between the substrate 10a closest to the side 21a and the substrate 20 is the dummy bump 35a. The bump located closest to the side 21b among the bumps located between the substrate 10b closest to the side 21b and the substrate 20 is the dummy bump 35b. The bump located closest to the side 21b among the bumps located between the substrate 10a and the substrate 20 is the connection bump 36. The bump located closest to the side 21a among the bumps located between the substrate 10b and the substrate 20 is the connection bump 36.

As described above, when a plurality of substrates 10a through 10c are provided, the dummy bumps 35a and 35b are located closer to the side 21a or 21b, and other bumps are made to be the connection bumps 36. This structure further inhibits the malfunction of the bump.

As in the third embodiment, the bumps located between the substrate 10c, which is located between the substrate 10a and the substrate 10b, and the substrate 20 may include dummy bumps, but are preferably all the connection bumps 36. Stress applied to the bump under the substrate 10c is small. Thus, even when the bumps under the substrate 10c are all the connection bumps 36, the bump malfunction does not occur. The substrate 10c is downsized by providing no dummy bump under the substrate 10c. A case where the number of the substrate 10c is one is described, but the number of the substrates 10c may be two or more.

As in the second embodiment, the substrate 10 may be a single substrate.

In the first through third embodiments, the substrate 10, at least one of the substrates 10a and 10b, and at least one of the substrates 10a through 10c are a rotated Y-cut X-propagation lithium tantalate substrate or a rotated Y-cut X-propagation lithium niobate substrate, and the direction from the side 21a to the side 21b is in the X-axis orientation direction. In the rotated Y-cut X-propagation lithium tantalate substrate and the rotated Y-cut X-propagation lithium niobate substrate, the linear thermal expansion coefficient in the X-axis orientation is the largest. Thus, the thermal stress in the x-axis orientation direction is large. Therefore, in this structure, the dummy bumps 35a and 35b are preferably located adjacent to the sides 21a and 21b.

The substrate 20 has a substantially rectangular shape, and the sides 21a and 21b are shorter sides. When the substrate 20 has a rectangular shape, stress applied to the bump adjacent to the shorter side is large. Thus, the dummy bumps 35a and 35b are preferably located adjacent to the sides 21a and 21b.

The acoustic wave element 12a (a first acoustic wave element) is preferably located between the dummy bump 35a and the connection bump 36, and the acoustic wave element 12b (a second acoustic wave element) is preferably located between the dummy bump 35b and the connection bump 36. This configuration allows the connection bump 36 to be located near the center of the substrate 20. Thus, the stress applied to the connection bump 36 is reduced, and thereby the bump malfunction is inhibited. The acoustic wave elements 12a and 12b may be surface acoustic wave elements illustrated in FIG. 7A, or piezoelectric thin film resonators illustrated in FIG. 7B.

The transmit filter 50 (a first filter) includes the acoustic wave element 12a, and the receive filter 52 (a second filter) includes the acoustic wave element 12b. This configuration allows the connection bump 36 to be located near the center of the substrate 20 more. The acoustic wave elements 12a and 12b may form one filter.

A duplexer is described as an example of the multiplexer, but the multiplexer may be a triplexer or a quadplexer. An example in which the first filter is a transmit filter and the second filter is a receive filter is described. However, the first filter may be a receive filter, and the second filter may be a transmit filter. Both the first filter and the second filter may be transmit filters or receive filters.

Although the embodiments of the present invention have been described in detail, it is to be understood that the various change, substitutions, and alterations could be made hereto without departing from the spirit and scope of the invention.

What is claimed is:

1. An acoustic wave device comprising:
   a first substrate including a terminal located on a lower surface thereof and having a substantially rectangular planar shape;
   at least one second substrate including an acoustic wave element located on a lower surface thereof and mounted on the first substrate so that the acoustic wave element faces an upper surface of the first substrate across an air gap;
   a plurality of first bumps located between the upper surface of the first substrate and the lower surface of the at least one second substrate, located between a first side of the first substrate and the acoustic wave element in a direction perpendicular to the first side in plan view, and not electrically connected to at least one of the acoustic wave element and the terminal;

a plurality of second bumps located between the upper surface of the first substrate and the lower surface of the at least one second substrate, located between a second side of the first substrate, which is opposite to the first side, and the acoustic wave element in the direction perpendicular to the first side in plan view, and not electrically connected to at least one of the acoustic wave element and the terminal; and a plurality of third bumps located between the upper surface of the first substrate and the lower surface of the at least one second substrate, located only in a region that is located closer to the second side than the plurality of first bumps are and closer to the first side than the plurality of second bumps are, and electrically connecting the acoustic wave element and the terminal, wherein the first side and the second side are shorter sides of the rectangular planar shape of the first substrate.

2. The acoustic wave device according to claim 1, wherein the at least one second substrate is a plurality of second substrates arranged in a direction from the first side to the second side of the first substrate;

wherein one of the plurality of second substrates is closest to the first side and includes the plurality of first bumps closest to the first side;

wherein one of the plurality of second substrates is closest to the second side and includes the plurality of second bumps closest to the second side;

wherein the one of the second substrates closest to the first side also includes one of the plurality of third bumps closest to the second side as compared to the first bumps; and wherein the one of the second substrates closest to the second side also includes one of the plurality of third bumps closest to the first side as compared to the second bumps.

3. The acoustic wave device according to claim 2, wherein all bumps located between a second substrate located between the second substrate closer to the first side and the second substrate closer to the second side among the plurality of second substrates and the first substrate are the third bumps.

4. The acoustic wave device according to claim 1, wherein the at least one second substrate is a single second substrate.

5. The acoustic wave device according to claim 1, wherein at least one of the at least one second substrate is a rotated Y-cut X-propagation lithium tantalate substrate or a rotated Y-cut X-propagation lithium niobate substrate, and the direction perpendicular to the first side in plan view is in a direction of an X-axis orientation of the at least one of the at least one second substrate.

6. The acoustic wave device according to claim 1, wherein all of a plurality of bumps located in a region, which is located closer to the second side than a first bump that is closest to the second side among the plurality of first bumps and is located closer to the first side than a second bump that is closest to the first side among the plurality of second bumps, are electrically connected to the acoustic wave element and the terminal.

7. The acoustic wave device according to claim 1, wherein the acoustic wave element includes a first acoustic wave element located between the plurality of first bumps and the plurality of third bumps and a second acoustic wave element located between the plurality of second bumps and the plurality of third bumps.

8. The acoustic wave device according to claim 7, further comprising:

a first filter including the first acoustic wave element; and
a second filter including the second acoustic wave element.

9. The acoustic wave device according to claim 1, further comprising:

a filter including the acoustic wave element.

10. The acoustic wave device according to claim 9, further comprising:

a multiplexer including the filter.

* * * * *